United States Patent
Nho et al.

(10) Patent No.: US 11,450,549 B2
(45) Date of Patent: Sep. 20, 2022

(54) SUBSTRATE TRANSFER APPARATUS AND SUBSTRATE TRANSFER SYSTEM USING THE SAME

(71) Applicant: Samsung Electronics Co., Ltd., Suwon-si (KR)

(72) Inventors: Heeseok Nho, Asan-si (KR); Sangil Choi, Yongin-si (KR); Seonggi Jeon, Jeungpyeong-gun (KR); Bongsu Cho, Asan-si (KR)

(73) Assignee: Samsung Electronics Co., Ltd.

( * ) Notice: Subject to any disclaimer, the term of this patent is extended or adjusted under 35 U.S.C. 154(b) by 93 days.

(21) Appl. No.: 16/990,370

(22) Filed: Aug. 11, 2020

(65) Prior Publication Data
US 2021/0202292 A1    Jul. 1, 2021

(30) Foreign Application Priority Data
Dec. 27, 2019    (KR) .................. 10-2019-0176980

(51) Int. Cl.
*H01L 21/683* (2006.01)
*B25J 15/06* (2006.01)

(52) U.S. Cl.
CPC ........ *H01L 21/6838* (2013.01); *B25J 15/065* (2013.01); *B25J 15/0658* (2013.01); *B25J 15/0691* (2013.01)

(58) Field of Classification Search
CPC ............... H01L 21/6838; B25J 11/0095; B25J 15/0616; B25J 15/065; B25J 15/0658; B25J 15/0683; B25J 15/0691
See application file for complete search history.

(56) References Cited

U.S. PATENT DOCUMENTS

| | | | | |
|---|---|---|---|---|
| 6,648,974 B1 * | 11/2003 | Ogliari | .............. | H01L 21/67748 118/719 |
| 7,055,535 B2 * | 6/2006 | Kunisawa | ........... | H01L 21/6838 134/157 |
| 7,396,022 B1 * | 7/2008 | Moghadam | ........... | B23B 31/307 118/500 |
| 7,780,505 B2 * | 8/2010 | Morita | .................. | B23B 31/307 451/289 |

(Continued)

FOREIGN PATENT DOCUMENTS

| | | |
|---|---|---|
| JP | H08148541 | 6/1996 |
| JP | 2003324143 | 11/2003 |

(Continued)

*Primary Examiner* — Dean J Kramer
(74) *Attorney, Agent, or Firm* — Myers Bigel, P.A.

(57) ABSTRACT

A substrate transfer apparatus includes: a body including a first surface to which a semiconductor substrate is suctioned and a second surface opposing the first surface, the first surface including a cavity disposed in a center region of the body and an attaching unit disposed on an edge of the body so as to surround the cavity and form negative pressure to suction the semiconductor substrate, and a connector connected to the second surface of the body and supporting the body, wherein the cavity includes a lower surface with at least one through hole penetrating the first and second surfaces of the body and connecting the cavity to an external space, and the cavity includes a side surface inclined at an angle of 2.9° to 5° with respect to the first surface at the edge of the body.

20 Claims, 8 Drawing Sheets

(56) References Cited

U.S. PATENT DOCUMENTS

| | | | | |
|---|---|---|---|---|
| 9,022,392 | B2* | 5/2015 | Jang | G03F 7/20 |
| | | | | 279/3 |
| 9,911,640 | B2* | 3/2018 | Kesil | H01L 21/67259 |
| 2003/0133776 | A1* | 7/2003 | Lee | H01L 21/68707 |
| | | | | 414/416.03 |
| 2004/0187791 | A1 | 9/2004 | Busse et al. | |
| 2015/0321321 | A1 | 11/2015 | Kim et al. | |
| 2016/0260624 | A1* | 9/2016 | Iida | H01J 37/32009 |

FOREIGN PATENT DOCUMENTS

| | | |
|---|---|---|
| JP | 2007329297 | 12/2007 |
| JP | 2009059763 | 3/2009 |
| JP | 2012089627 | 5/2012 |
| KR | 100583562 | 5/2006 |
| KR | 101600382 | 3/2016 |
| KR | 1020180063612 | 6/2018 |
| KR | 1020180082132 | 7/2018 |

* cited by examiner

US 11,450,549 B2

SUBSTRATE TRANSFER APPARATUS AND SUBSTRATE TRANSFER SYSTEM USING THE SAME

CROSS-REFERENCE TO RELATED APPLICATION(S)

This application claims benefit of priority to Korean Patent Application No 10-2019-0176980, filed on Dec. 27, 2019, in the Korean Intellectual Property Office, the disclosure of which is incorporated herein by reference in its entirety.

TECHNICAL FIELD

The present disclosure relates to a substrate transfer apparatus and a substrate transfer system using the same.

BACKGROUND

Due to a thin and compact size of a semiconductor chip, there is continuous demand for a thin semiconductor substrate used in manufacturing the semiconductor chip. To this end, a backside grinding process is performed to thin a semiconductor substrate; however, a contact surface of a substrate transport apparatus for transferring the semiconductor substrate may be contaminated by particles attached to the semiconductor substrate during the process of transferring the ground semiconductor substrate. The particles attached to the substrate transfer apparatus may damage other semiconductor substrates being transferred, and may also damage semiconductor chips formed on the semiconductor substrate. Accordingly, research has been actively conducted to prevent damage to the other semiconductor substrates and semiconductor chips even in the case that particles are attached to the semiconductor substrate.

SUMMARY

An aspect of the present disclosure is to provide a substrate transfer apparatus for reducing damage to a semiconductor substrate during suction and transfer of the semiconductor substrate, and a substrate transfer system using the same.

According to an aspect of the present disclosure, a substrate transfer apparatus includes a body including a first surface to which a semiconductor substrate is suctioned and a second surface opposing the first surface, the first surface including a cavity disposed in a center region of the body and an attaching unit disposed on an edge of the body so as to surround the cavity and form negative pressure to suction the semiconductor substrate, and a connector connected to the second surface of the body and supporting the body, wherein the cavity includes a lower surface with at least one through hole penetrating the first and second surfaces of the body and connecting the cavity to an external space, and the cavity includes a side surface inclined at an angle of 2.9° to 5° with respect to the first surface at the edge of the body.

According to an aspect of the present disclosure, a substrate transfer apparatus includes a body including a first surface to which a semiconductor substrate is configured to be suctioned and a second surface opposing the first surface, the first surface including a cavity disposed in a center region of the body and an attaching unit disposed on an edge of the body so as to surround the cavity and form negative pressure to suction the semiconductor substrate, wherein the cavity includes a lower surface and at least one through hole penetrates the first and second surfaces and fluidly connects the cavity to an external space, and the cavity includes a side surface having a height difference of 0.5 mm to 1 mm with respect to the first surface at the edge of the body.

According to an aspect of the present disclosure, a substrate transfer system includes a chuck table for performing a grinding process on a semiconductor substrate seated on an upper surface of the chuck table, and a substrate transfer apparatus disposed on an upper portion of the semiconductor substrate and configured to adhere to the semiconductor substrate on which the grinding process has been performed, wherein the substrate transfer apparatus includes a body having a first surface to which a semiconductor substrate is configured to be adhered and a second surface opposing the first surface, the first surface having a cavity disposed in a center region of the body and an attaching unit disposed on an edge of the body so as to surround the cavity and form negative pressure to adhere to the semiconductor substrate, and a connector configured to connect to the second surface of the body and to support the body, wherein the cavity includes a lower surface with at least one through hole penetrating the first and second surfaces and connecting the cavity to an external space, and the cavity includes a side surface inclined at an angle of 2.9° to 5° with respect to the first surface at the edge of the body.

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION

Hereinafter, example embodiments of the present disclosure will be described with reference to the accompanying drawings.

Figure 1:
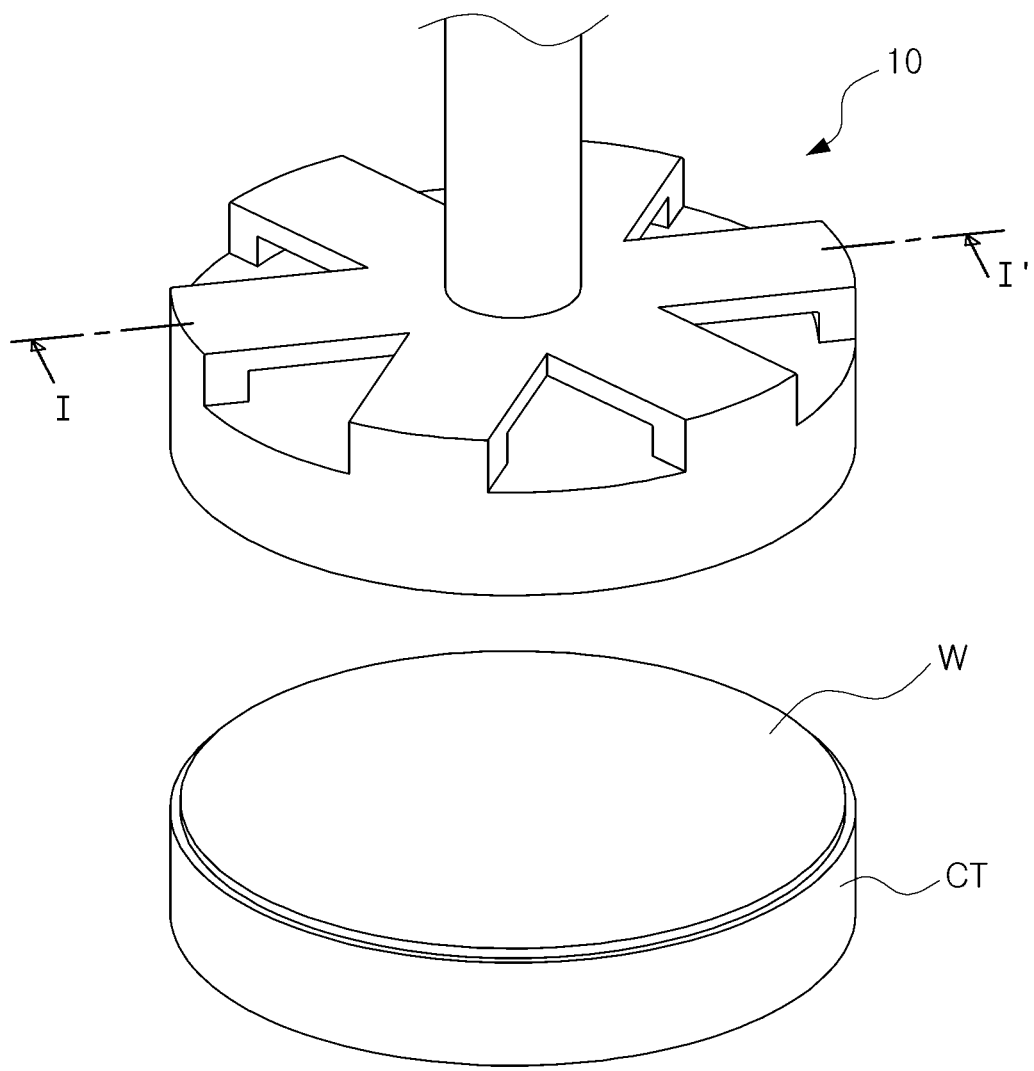
FIG. 1 is a perspective view schematically illustrating a substrate transfer system according to an example embodiment of the present disclosure.
Figure 2:
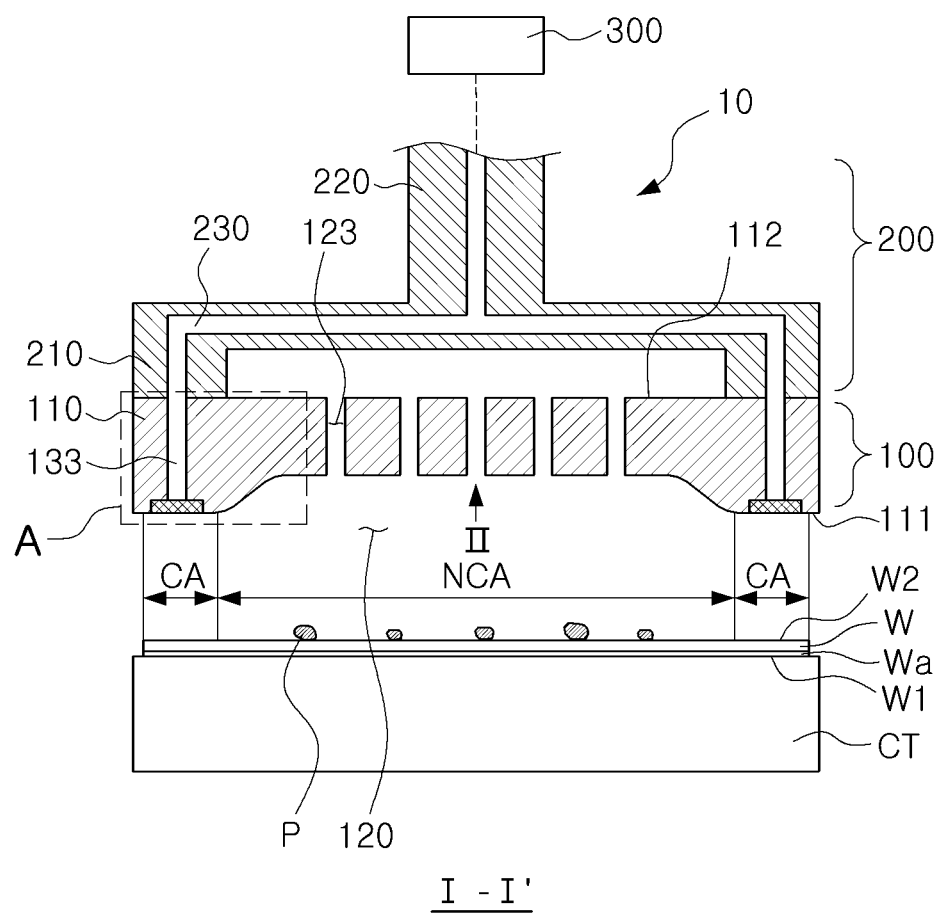
FIG. 2 is a side cross-sectional view taken along line I-I' of FIG. 1.

With reference to FIGS. 1 and 2, a substrate transfer apparatus according to an example embodiment will be described. FIG. 1 is a perspective view schematically illustrating a substrate transfer system according to an example embodiment of the present disclosure, and FIG. 2 is a side cross-sectional view taken along line I-I' of FIG. 1.

Based on FIGS. 1 and 2, a substrate transfer system 1 according to an example embodiment may include a chuck table CT, on which a semiconductor substrate W may be seated, and a substrate transfer apparatus 10 for suctioning or adhering to the semiconductor substrate W seated on the chuck table CT. The substrate transfer system 1 may be applied to a backgrinding apparatus for thinning or reducing a thickness of the semiconductor substrate W and may be disposed inside a process chamber of the backgrinding apparatus.

On an upper surface of the chuck table CT, a semiconductor substrate W, having been processed, may be disposed. The semiconductor substrate W may be a circular wafer. A semiconductor layer Wa may be formed on one surface of the semiconductor substrate W and may be disposed on a lower surface W1 of the semiconductor substrate W to face the chuck table CT. Accordingly, an upper surface W2 of the semiconductor substrate W may be disposed on the chuck table to face upward or away from the chuck table CT, and the lower surface W1 may be disposed to face the chuck table CT. The substrate transfer apparatus 10 may suction the upper surface W2 of the semiconductor substrate W. The semiconductor substrate W may be suctioned to the chuck table CT by vacuum for the process. In an example embodiment, the process may be a process of grinding the upper surface of the semiconductor substrate W. After the back grinding process, air may be jetted over the suctioned semiconductor substrate W to separate the chuck table CT from the semiconductor substrate W. The substrate transfer apparatus 10 may transfer the separated semiconductor substrate W by vacuum or suction.

A plurality of semiconductor dies may be formed on the semiconductor layer Wa. When viewed from a top, a known good die, which has been confirmed to normally operate, may be disposed in a center region of the semiconductor layer Wa, and a dummy die may be disposed in an edge region of the semiconductor layer Wa. In an example embodiment, the semiconductor substrate W may be a semiconductor wafer having a diameter of 304 mm to 307 mm and may have a thickness of 30 μm to 50 μm after the back grinding process.

A process of grinding the upper surface W2 of the semiconductor substrate W may be performed on the chuck table CT. During this process, particles P, a grinding byproduct, may be attached to the upper surface W2 of the semiconductor substrate W. The particles P may create a flaw or a crack in or on the semiconductor substrate W when the substrate transfer apparatus 10 suctions the semiconductor substrate W. Further, the semiconductor layer formed on the semiconductor substrate W may be damaged due to the flaw or crack of the semiconductor substrate W, thereby giving rise to a poor semiconductor chip. The particles P may contaminate a portion where the substrate transfer apparatus 10 meets the semiconductor substrate W and may thus create a flaw of another semiconductor substrate W, which is subsequently transferred, or crack the semiconductor layer. The substrate transfer system of an example embodiment may have reduced cracking of the semiconductor substrate or reduced damage on the semiconductor chip even in the case that particles P are attached to the semiconductor substrate W. This will be described below.

The substrate transfer apparatus 10 may include a body 100 for suctioning the semiconductor substrate W and a connector 200 supporting the body 100.

The body 100 may have a first surface 111 in contact with the semiconductor substrate W and a second surface 112 opposing the first surface 111 and may be formed of a circular base 110. The shape of the body 100 is not limited to circular and may be polygonal such as tetragonal, or the like. The base 110 may be formed of a ceramic material. The base 110 may be formed to be thick enough to form a cavity 120 at or on the first surface 111 thereof.

Based on FIG. 2, the first surface 111 of the body 100 is a surface, to which the semiconductor substrate W is suctioned, and may have a contact area CA in direct contact with the semiconductor substrate W and a non-contact area NCA not in direct contact with the semiconductor substrate W. The non-contact area NCA may be disposed in a center region of the first surface 111, whereas the contact area CA may be disposed on an edge or edge region of the first surface 111 to surround the non-contact area NCA. The contact area CA may be disposed to correspond to the region in which the dummy die of the semiconductor substrate W is disposed. Accordingly, as the contact area CA is limitedly disposed in the region on the semiconductor substrate W, corresponding to the dummy die, the known good die can be prevented from being damaged even in the case that the particles P are attached to the contact area CA.

Figure 3:
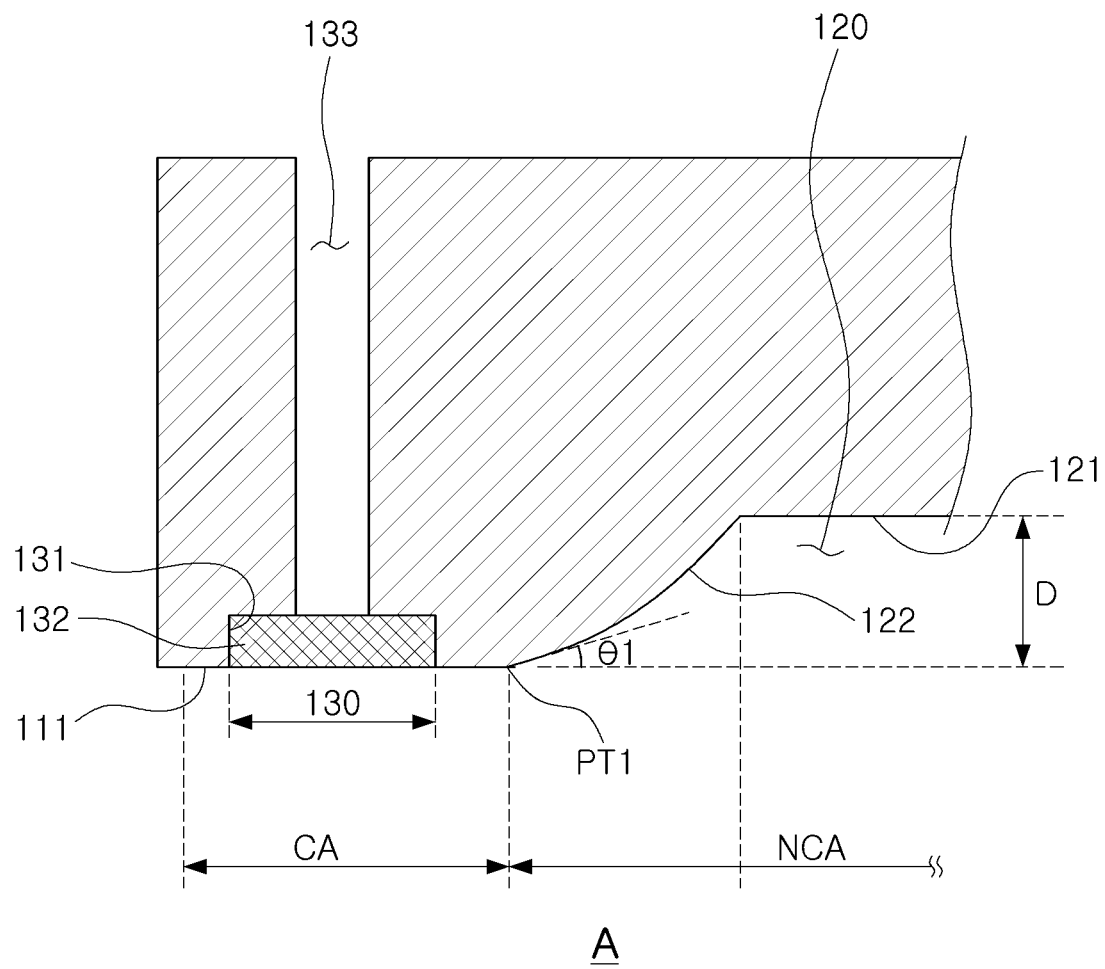
FIGS. 3 and 4 are diagrams illustrating various example embodiments of an inclined surface of FIG. 2.

Based on FIG. 3, the attaching unit or attaching system 130 forming negative pressure for suctioning the semiconductor substrate W may be disposed in the contact region CA. The attaching unit 130 is configured to suction air through a suction plate 132 to form negative pressure in a surrounding area.

Figure 6:
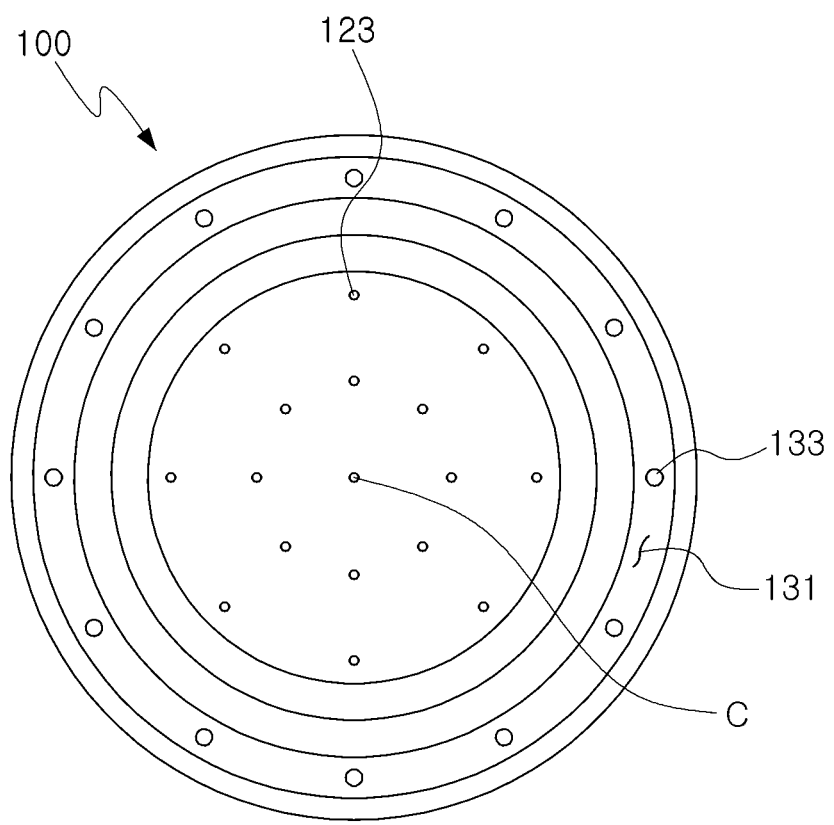
FIG. 6 is a cross-sectional view of FIG. 5 excluding a suction plate.

The attaching unit 130 may include a groove 131 disposed on the edge of the first surface 111, an exhaust hole or exhaust channel 133 and the suction plate 132 inserted to the groove 131. The groove may be formed in the contact area CA at a predetermined depth and may be disposed with the exhaust hole 133 at or on a lower surface of the groove 131. The exhaust hole 133 may be formed to connect the lower surface of the groove 131 and the second surface 112 of the body 100. As illustrated in FIG. 6, the exhaust hole 133 may be radially disposed on the lower surface of the groove 131; however, an arrangement of the exhaust hole 133 is not limited to that illustrated in FIG. 6 and may be subject to various modifications.

As illustrated in FIG. 2, the exhaust hole 133 may be connected to a vacuum source 300 via a connection hole or connection channel 230 of the connector 200. The suction plate 132 formed of a porous material is inserted into the groove 131 and can thus suction air while providing sufficient support to attach the semiconductor substrate. In an example embodiment, the suction plate 132 may be formed of a porous ceramic material.

As the cavity 120 is disposed in the non-contact area NCA, the body 100 is prevented from being in direct contact with the particles P by the cavity even in the case that the particles P are attached to the semiconductor substrate W.

As illustrated in FIG. 3, the cavity 120 may be disposed in the center region of the body 100 and may have a height difference D with the edge region or the contact area CA of the body 100 such that the particles P attached to a surface of the suctioned semiconductor substrate W do not reach the center region or the non-contact area NCA of the body 100. In an example embodiment, the cavity 120 may be formed to have a height difference D of 0.5 mm to 1 mm. When the height difference D of the cavity 120 is less than 0.5 mm, the height difference D of the cavity 120 may be smaller than an average size of the particles P generated during the grinding of the semiconductor substrate W, thereby causing the particles P to be attached to the lower surface 121 of the cavity 120. In contrast, when the height difference D of the cavity 120 exceeds 1 mm, the height difference D of the cavity 120 considerably increases compared to the thickness of the ground semiconductor substrate W, thereby reducing the effect of preventing a deformation of the semiconductor substrate W by an air pressure caused by the air jetted during the separation of the semiconductor substrate W from the chuck table CT.

The lower surface 121 of the cavity 120 may be formed to be planar, but is not limited thereto; the lower surface 121 may be formed to be a curved surface depending on example embodiments.

Figure 5:
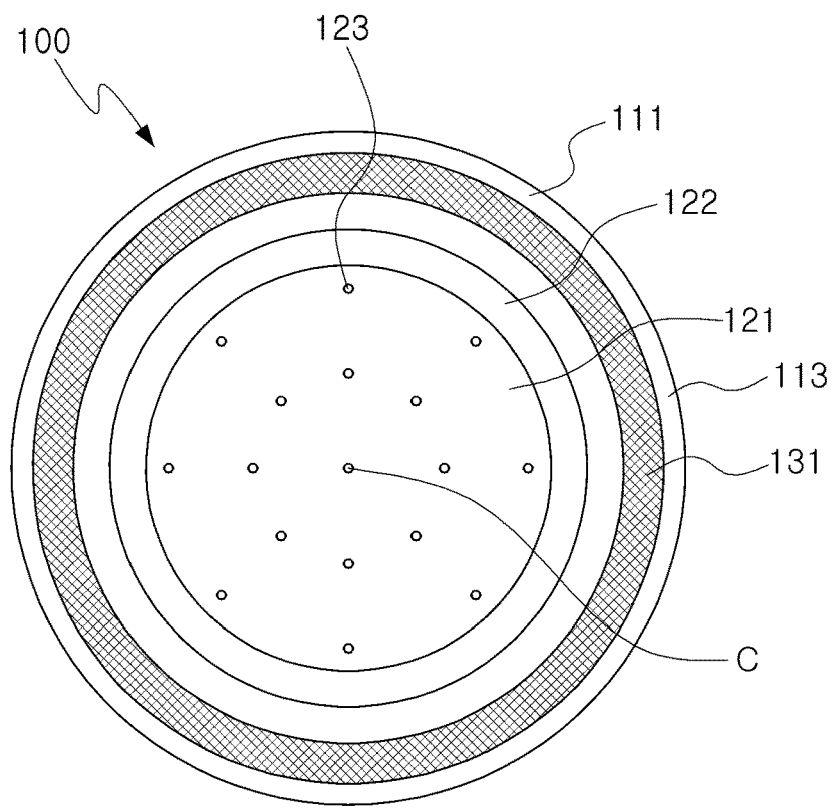
FIG. 5 is a cross-sectional view take along line II of FIG. 2.

Based on FIGS. 2 and 5, one or more through holes 123 may be disposed at or on the lower surface 121 of the cavity 120. As the through hole 123 is formed to penetrate the lower surface 121 of the cavity 120 and the second surface 112 of the body 100, an air may flow into the cavity 120 through the through hole 123 even in the case that the semiconductor substrate W is suctioned to the first surface 111 of the body 100. Accordingly, the cavity 120 can be prevented from being in a negative pressure state by maintaining an internal air pressure of the cavity to be equivalent to an air pressure inside the process chamber.

Figure 9:
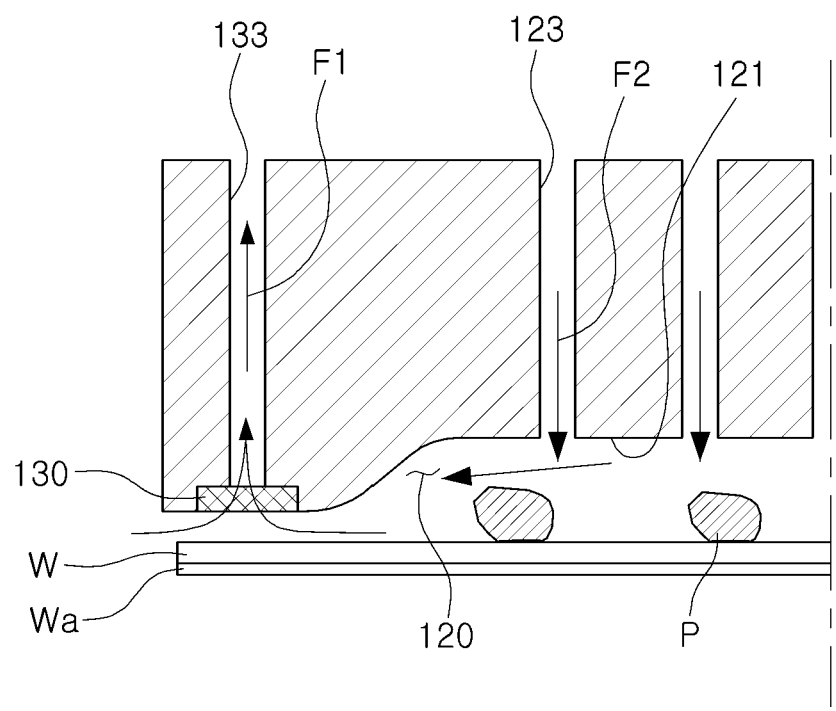
FIG. 9 is a diagram illustrating an effect of removing negative pressure according to an example embodiment.

This will be described with reference to FIGS. 9 and 10. FIG. 9 is a diagram illustrating an effect of removing negative pressure according to an example embodiment, and FIG. 10 is a diagram illustrating a comparative example in which a through hole is not formed.

Figure 10:
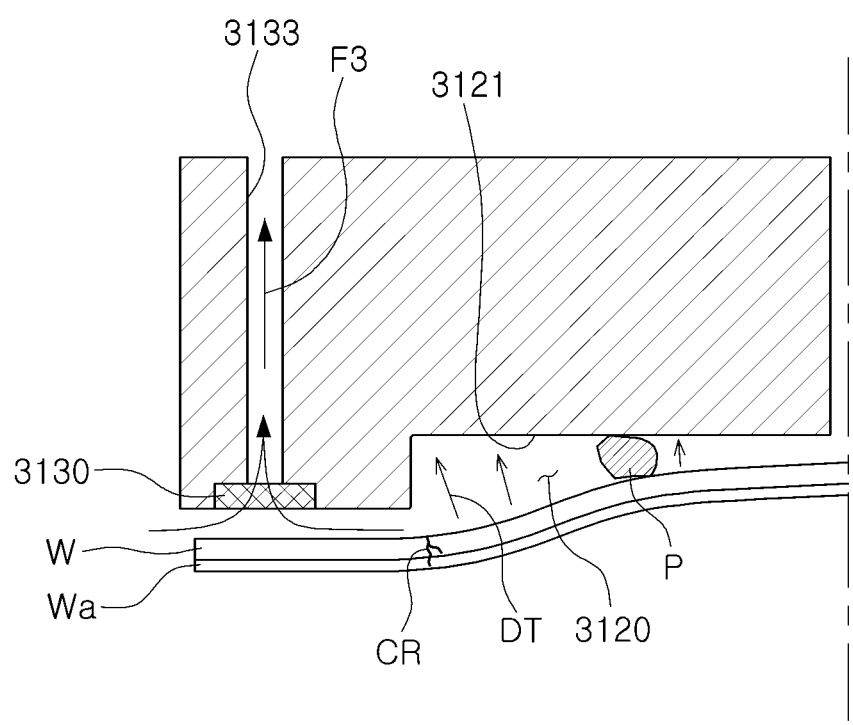
FIG. 10 is a diagram illustrating a comparative example in which a through hole is not formed.

Based on FIG. 10, an attaching unit 3130 intakes nearby air and discharges the same into the exhaust hole 3133 (F3). As there is also an intake of air in the cavity 3120 during this process, an air pressure inside the cavity 3120 is in a lower negative pressure state compared to that outside. The semiconductor substrate W, which has been background, is very thin and becomes vulnerable to an external pressure. When such semiconductor substrate W is attached to the body 100, the center region of the semiconductor substrate W may be deformed to be concave toward a direction DT of the lower surface 3121 of the cavity 3120 due to the negative pressure of the cavity 3120. This deformation may create a crack CR on the semiconductor substrate W or break a semiconductor chip formed on the semiconductor layer Wa. Further, when the semiconductor substrate W becomes concave, a distance between the particles P attached to the semiconductor substrate W and the lower surface 3121 of the cavity 3120 is reduced, thereby causing a contamination that the particles P are attached to the lower surface 3121 of the cavity 3120.

In contrast, as illustrated in FIG. 9, in an example embodiment, the attaching unit 130 intakes the nearby air and discharges the same to the exhaust hole 133 (F1), and external air may flow in through the through hole 123 (F2). Accordingly, the cavity 120 can be prevented from being in a negative pressure state, and the semiconductor substrate W and the semiconductor chip of the semiconductor layer Wa may be prevented from being damaged.

Figure 7:
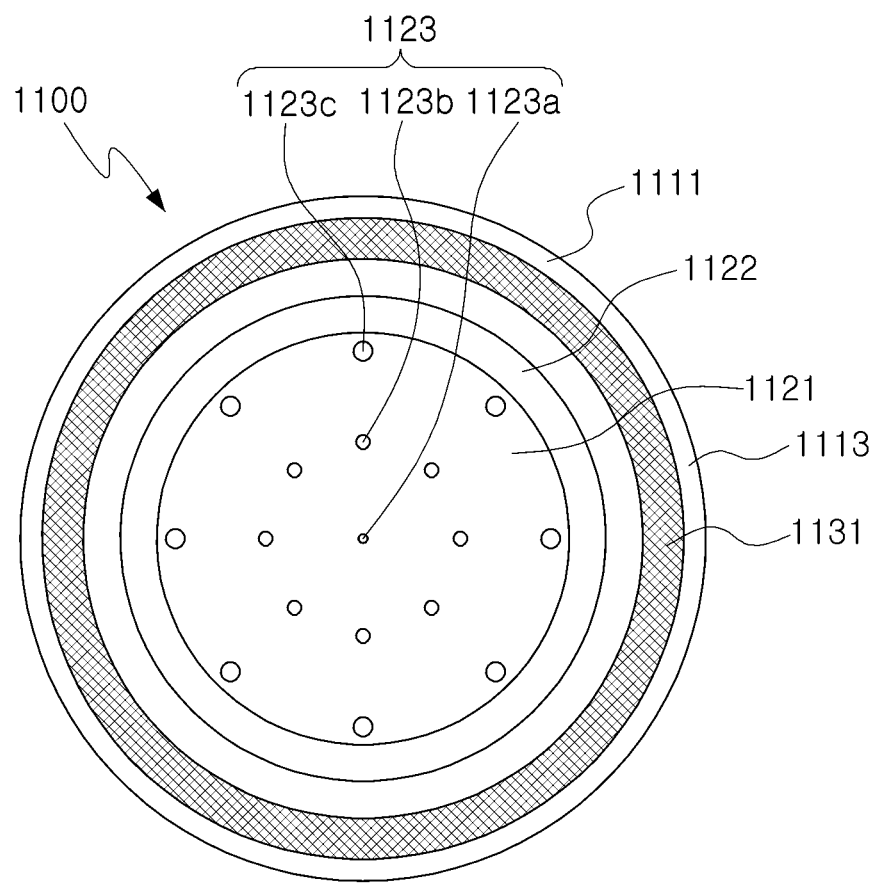
FIGS. 7 and 8 are diagrams illustrating various example embodiments of a through hole formed on a lower surface of FIG. 5.

The through hole 123 may be formed to be circular, and at least one may be disposed at or on the lower surface 121 of the cavity 120. Further, as illustrated in FIG. 5, the through hole 123 may be disposed in plural on the lower surface 121 of the cavity 120. In an example embodiment, a plurality of the through holes 123 may be radially disposed with respect to a center C of the lower surface 121. In addition, a plurality of the through holes 123 may have the same size, but may have different shapes according to example embodiments. FIG. 7 illustrates an example embodiment in which, when the through hole 1123 is formed of a plurality of through holes 1123a to 1123c, a plurality of the through holes 1123a to 1123c have an increasing size in a direction from the center of the cavity 120 to the edge, that is, a case in which the size of the through hole 1123 increases in the direction from the center of the cavity 120 toward the edge. Accordingly, the size of the through hole 1123c disposed on the edge of the cavity 1121 may be comparatively larger than that of the through holes 1123a and 1123b formed in the other regions. This enables the air pressured toward the side surface 1122 of the cavity to be quickly discharged by the semiconductor substrate W separated by the pressure of the air jetted from the chuck table CT during the separation of the chuck table CT and the semiconductor substrate W by the air jet. Accordingly, the semiconductor substrate W can be prevented from being damaged when separated from the chuck table CT.

Figure 8:
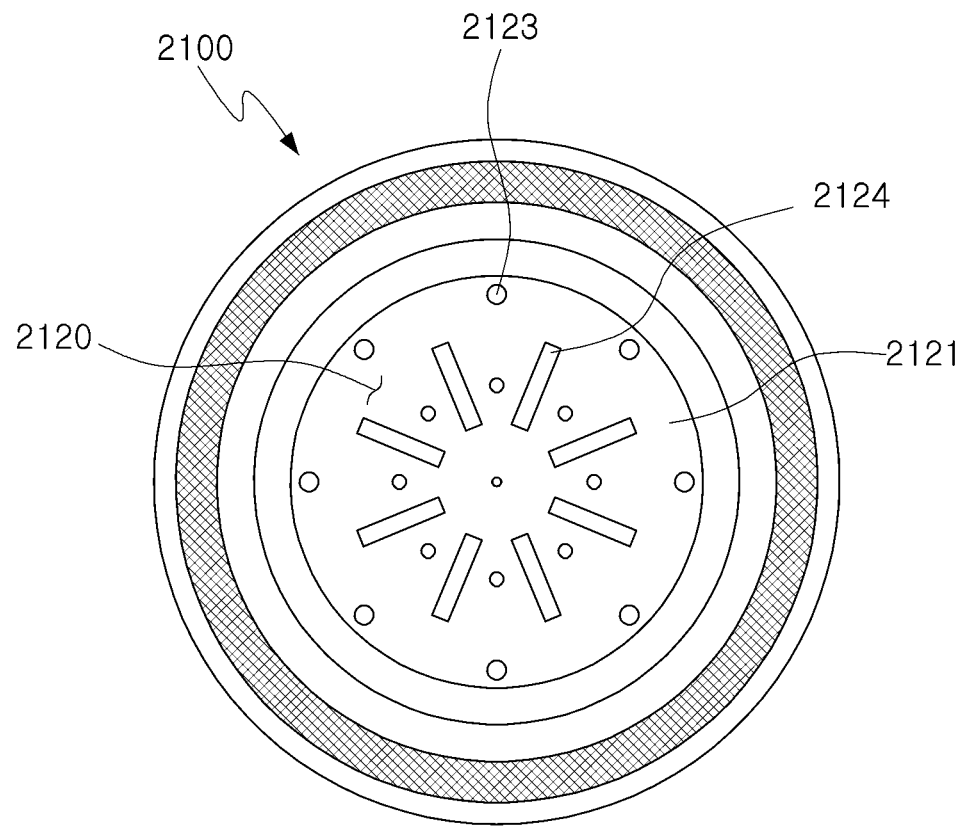

Meanwhile, according to an example embodiment illustrated in FIG. 8, one or more projections 2124 for supporting the semiconductor substrate may be further disposed on the lower surface 2121 of the cavity 2120 of the body 2100. The projection 2124 is disposed between a plurality of the through holes 2123 and may support the semiconductor substrate to effectively prevent the same from being concavely bent toward the lower surface of the cavity when the semiconductor substrate separated from the chuck table by the air jet pressure.

As illustrated in FIG. 3, the side surface 122 of the cavity 120 may be formed of an inclined surface of the curved surface. The side surface 122, while inclining from the attaching unit 130 or the contact area CA of the body 100 toward the lower surface 121 of the cavity 120, may be formed to have a convex curved surface. Accordingly, the side surface 122 of the cavity 120 may be disposed such that an angle θ1 of a contact point PT1 in contact with the semiconductor substrate W falls within a predetermined range when the semiconductor substrate W is attached thereto. In an example embodiment, the predetermined range may be 2.9° to 5°. The contact point PTI may be at the intersection of the contact area CA and the non-contact area NCA of the body 100.

When the semiconductor substrate W is separated from the chuck table CT by the air jet, the contact area CA of the semiconductor substrate W is attached and fixed to the attaching unit 130. In contrast, the non-contact area NCA is not fixed and may thus be bent toward the lower surface 121 of the cavity 120. Accordingly, there may be a crack generated at the contact point PT1, a boundary between the region attached to the attaching unit 130 and the region not attached thereto. In an example embodiment, the semiconductor substrate W can be prevented from being cracked by arranging the angle of the contact point PT1 to be as small as 2.9° to 5°.

Figure 4:
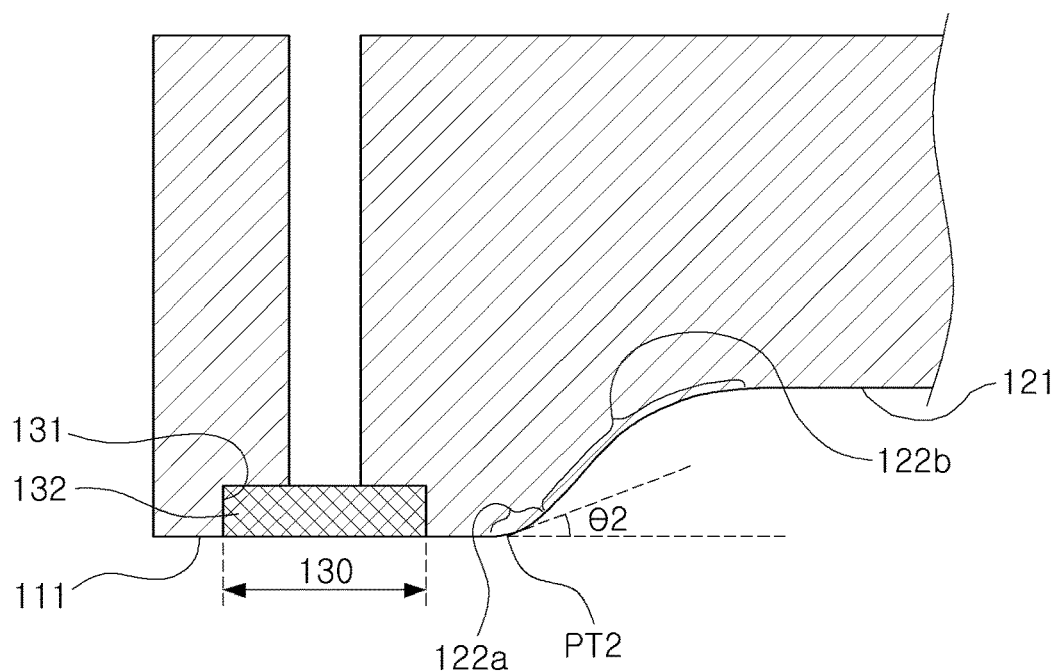

In addition, the side surface 122 of the cavity 120 may be formed of a plurality of curved surfaces. For example, as illustrated in FIG. 4, the side surface 122 may be formed of a first curved surface 122a and a second curved surface 122b. The first and second curved surfaces 122a and 122b may be curved surface having different radii of curvature. The second curved surface 122b may be formed to have a radius of curvature gradually increasing toward the lower surface 121 of the cavity 120. Further, a minimum value of the radius of curvature of the second curved surface 122b may be larger than that of the first curved surface 122a. Accordingly, the second curved surface 122b may have a gentle curved surface relative to the first curved surface 122a while maintaining an angle of a contact point PT2 of the first curved surface 122a in contact with the semiconductor substrate W to be in a predetermined range. In an example embodiment, the first curved surface 122a may be formed to be convex with a radius of curvature of 0.5 mm when the height difference D of the cavity 120 is 1 mm, thereby enabling the angle θ2 of the point in contact with the semiconductor substrate W to be in the range of 2.9° to 5°.

The second curved surface 122b is formed to be concave to have a radius of curvature larger than 0.5 mm so as to be smoothly connected to the lower surface 121 of the first curved surface 122a.

The example embodiment, in which the first and second curved surfaces 122a and 122b are formed on the side surface 122, Comparative Example 1 in which the side surface is formed as a vertical surface, and Comparative Example 2 in which a curved surface is formed but the first curved surface is formed only were compared in terms of stress on the semiconductor chip, and a result thereof is shown in Table 1 below. When compared to Comparative Example 1 and 2, the example embodiment showed reduced chip stress by 82% and 81%, respectively. In this regard, it can be understood that the effect of preventing damage on the semiconductor chip is enhanced.

TABLE 1

|  | Comparative Example 1 | Comparative Example 2 | Example Embodiment |
| --- | --- | --- | --- |
| Chip Stress (MPa) | 117.9 | 109.4 | 20.6 |

The connector 200 may be attached to the second surface 112 of the body 100. The connector 200 connects the body 100 to a transfer mechanism, such as a robot arm, such that the body 100 suctions the semiconductor substrate W and separate the same from the chuck table CT to transfer the semiconductor substrate W. The connector 200 may include a body connector 210 attached to or connected to the second surface 112 of the body 100 and a robot arm connector 220 connected to the robot arm. The connection hole 230 is formed inside the body connector 210 and the robot arm connector 220 to connect the exhaust hole 133 and the vacuum source 300.

The connector 200 transfers the body 100 to the upper portion of the chuck table CT such that the attaching unit 130 of the body 100 is disposed to correspond to the region in which the dummy die of the semiconductor substrate W is disposed. The connector 200 also lowers the body 100 such that the attaching unit 130 is limited to suction the region in which the dummy die is disposed.

As set forth above, according to example embodiments, a substrate transfer apparatus and a substrate transfer system using the same can reduce damage on a semiconductor substrate.

Various advantages and beneficial effects of the present disclosure are not limited to the above descriptions and may be easily understood in the course of describing the specific embodiments of the present disclosure.

While example embodiments have been shown and described above, it will be apparent to those skilled in the art that modifications and variations could be made without departing from the scope of the present disclosure as defined by the appended claims.

What is claimed is:

1. A substrate transfer apparatus, comprising:
a body comprising a first surface to which a semiconductor substrate is suctioned and a second surface opposing the first surface, the first surface comprising a cavity disposed in a center region of the body and an attaching unit disposed on an edge of the body so as to surround the cavity and form negative pressure to suction the semiconductor substrate; and
a connector connected to the second surface of the body and supporting the body,
wherein the cavity comprises a lower surface with at least one through hole penetrating the first and second surfaces of the body and connecting the cavity to an external space, and the cavity comprises a side surface inclined at an angle of 2.9° to 5° with respect to the first surface at the edge of the body,
wherein the connector is attached to the second surface of the body at a region corresponding to the attaching unit and a separation space is defined between the connector and the second surface of the body at a region corresponding to the cavity.

2. The substrate transfer apparatus of claim 1, wherein the side surface comprises a curved surface,
wherein the curved surface comprises a first curved surface adjacent the attaching unit and a second curved surface disposed between the first curved surface and the lower surface,
wherein the first and second curved surfaces have different radii of curvature.

3. The substrate transfer apparatus of claim 2, wherein the second curved surface has a gradually increasing radius of curvature toward the lower surface.

4. The substrate transfer apparatus of claim 3, wherein a minimum value of the radius of curvature of the second curved surface is larger than a radius of curvature of the first curved surface.

5. The substrate transfer apparatus of claim 2, wherein the first curved surface is a convex surface and the second curved surface is a concave surface.

6. The substrate transfer apparatus of claim 1, wherein the attaching unit comprises:
an annular groove disposed on the edge of the body to surround the cavity;
an exhaust hole disposed on a lower surface of the groove and penetrating the lower surface of the groove and the second surface of the body; and
a suction plate filling the groove.

7. The substrate transfer apparatus of claim 6, wherein the suction plate is formed of a porous ceramic material.

8. The substrate transfer apparatus of claim 1, wherein the through hole comprises a plurality of through holes,
wherein the plurality of through holes are disposed radially outwardly from a center of the center region of the body.

9. The substrate transfer apparatus of claim 1, wherein the through hole comprises a plurality of through holes,
wherein the plurality of through holes have a sequentially increasing diameter in a radially outward direction from the center region of the body to the edge of the body.

10. The substrate transfer apparatus of claim 1, wherein the cavity has a height difference of 0.5 mm to 1 mm with respect to the first surface at the edge of the body.

11. The substrate transfer apparatus of claim 1, wherein the body comprises an exhaust hole penetrating an interior thereof,
wherein the connector comprises a connection hole penetrating an interior thereof, and
wherein the exhaust hole is connected to the connection hole of the connector.

12. A substrate transfer apparatus, comprising:
a body comprising a first surface to which a semiconductor substrate is configured to be suctioned and a second surface opposing the first surface, the first surface comprising a cavity disposed in a center region of the body and an attaching unit disposed on an edge of the body so as to surround the cavity and form negative pressure to suction the semiconductor substrate, wherein the cavity comprises a lower surface and at least one through hole penetrates the first and second surfaces of the body and fluidly connects the cavity to an external space, and the cavity comprises a side surface having a height difference of 0.5 mm to 1 mm with respect to the first surface at the edge of the body, wherein the side surface of the cavity comprises a first convex surface adjacent the attaching unit and a second concave surface between the first convex surface and the lower surface of the cavity.

13. The substrate transfer apparatus of claim 12, further comprising a connector configured to connect to the second surface of the body and to support the body,
    wherein the connector comprises a connection hole penetrating an interior thereof.

14. The substrate transfer apparatus of claim 13, wherein the attaching unit comprises:
    an annular groove disposed on the edge of the body to surround the cavity;
    an exhaust hole penetrating a lower surface of the groove and the second surface of the body; and
    a suction plate filling the groove,
    wherein the exhaust hole is connected to the connection hole of the connector.

15. The substrate transfer apparatus of claim 12, wherein the first convex surface and the second concave surface have different radii of curvature.

16. The substrate transfer apparatus of claim 15, wherein the second concave surface has a gradually increasing radius of curvature toward the lower surface of the cavity.

17. The substrate transfer apparatus of claim 16, wherein a minimum value of the radius of curvature of the second concave surface is larger than a radius of curvature of the first convex surface.

18. A substrate transfer system, comprising:
    a chuck table for performing a grinding process on a semiconductor substrate seated on an upper surface of the chuck table; and
    a substrate transfer apparatus disposed on an upper portion of the semiconductor substrate and configured to adhere to the semiconductor substrate on which the grinding process has been performed,
    wherein the substrate transfer apparatus comprises:
    a body comprising a first surface to which a semiconductor substrate is configured to be adhered and a second surface opposing the first surface, the first surface having a cavity disposed in a center region of the body and an attaching unit disposed on an edge of the body so as to surround the cavity and form negative pressure to adhere to the semiconductor substrate; and
    a connector configured to connect to the second surface of the body and to support the body,
    wherein the cavity comprises a lower surface with at least one through hole penetrating the first and second surfaces and connecting the cavity to an external space, and the cavity comprises a side surface inclined at an angle of 2.9° to 5° with respect to the first surface at the edge of the body, and
    wherein the attaching unit comprises:
    an annular groove disposed on the edge of the body to surround the cavity;
    an exhaust hole disposed on a lower surface of the groove and penetrating the lower surface of the groove and the second surface of the body; and
    a suction plate filling the groove.

19. The substrate transfer system of claim 18, wherein the semiconductor substrate is configured to be separated from the chuck table by an air jet of the chuck table and to be adhered to the attaching unit.

20. The substrate transfer system of claim 18, wherein the suction plate is formed of a porous ceramic material.

* * * * *